United States Patent
Lin et al.

(10) Patent No.: US 9,209,126 B2
(45) Date of Patent: Dec. 8, 2015

(54) SELF-ALIGNED FINE PITCH PERMANENT ON-CHIP INTERCONNECT STRUCTURES AND METHOD OF FABRICATION

(75) Inventors: Qinghuang Lin, Yorktown Heights, NY (US); Sanjay Mehta, Niskayuna, NY (US); Hosadurga Shobha, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/606,788

(22) Filed: Sep. 7, 2012

(65) Prior Publication Data

US 2013/0032949 A1    Feb. 7, 2013

Related U.S. Application Data

(63) Continuation of application No. 13/197,325, filed on Aug. 3, 2011, now Pat. No. 8,822,137.

(51) Int. Cl.
*H01L 23/522* (2006.01)
*H01L 23/532* (2006.01)
*H01L 21/768* (2006.01)

(52) U.S. Cl.
CPC ........ *H01L 23/5222* (2013.01); *H01L 21/7682* (2013.01); *H01L 21/76807* (2013.01); *H01L 21/76816* (2013.01); *H01L 21/76825* (2013.01); *H01L 21/76826* (2013.01); *H01L 21/76828* (2013.01); *H01L 21/76829* (2013.01); *H01L 23/53295* (2013.01); *H01L 21/768* (2013.01); *H01L 21/76801* (2013.01); *H01L 21/76802* (2013.01); *H01L 2221/1026* (2013.01); *H01L 2924/0002* (2013.01)

(58) Field of Classification Search
CPC ..................................................... H01L 21/396
USPC ................................................... 257/773, 774
See application file for complete search history.

(56) References Cited

U.S. PATENT DOCUMENTS

| | | | |
|---|---|---|---|
| 4,783,646 A | 11/1988 | Matsuzaki | |
| 4,808,545 A | 2/1989 | Balasubramanyam et al. | |
| 5,426,319 A | 6/1995 | Notani | |
| 5,430,441 A | 7/1995 | Bickley et al. | |
| 5,461,003 A | 10/1995 | Havemann et al. | |
| 5,651,857 A | 7/1997 | Cronin et al. | |

(Continued)

FOREIGN PATENT DOCUMENTS

KR       100809901 B1       3/2008

OTHER PUBLICATIONS

Maenhoudt, M., et al. "Alternative Process Schemes for Double Patterning That Elminate the Intermediate Etch Step" Proc. of SPIE, vol. 6924, 69240P. Feb. 2008. pp. 1-12.

(Continued)

*Primary Examiner* — William Harriston
(74) *Attorney, Agent, or Firm* — Tutunjian & Bitetto, P.C.

(57) ABSTRACT

An interconnect structure and methods for making the same include sidewall portions of an interlevel dielectric layer. The sidewall portions have a width less than a minimum feature size for a given lithographic technology and the width is formed by a thickness of the interlevel dielectric layer when conformally formed on vertical surfaces of a mandrel. The sidewall portions form spaced-apart openings. Conductive structures fill the spaced-apart openings and are separated by the sidewall portions to form single damascene structures.

9 Claims, 8 Drawing Sheets

(56) References Cited

U.S. PATENT DOCUMENTS

| | | | |
|---|---|---|---|
| 5,795,830 A | 8/1998 | Cronin et al. | |
| 5,976,768 A | 11/1999 | Brown et al. | |
| 5,981,148 A | 11/1999 | Brown et al. | |
| 6,007,968 A | 12/1999 | Furukawa et al. | |
| 6,014,422 A | 1/2000 | Boyd et al. | |
| 6,025,260 A | 2/2000 | Lien et al. | |
| 6,093,508 A | 7/2000 | Cote | |
| 6,114,082 A | 9/2000 | Hakey et al. | |
| 6,150,256 A | 11/2000 | Furukawa et al. | |
| 6,184,041 B1 | 2/2001 | Furukawa et al. | |
| 6,194,268 B1 | 2/2001 | Furukawa et al. | |
| 6,200,726 B1 | 3/2001 | Chen et al. | |
| 6,214,719 B1* | 4/2001 | Nag | 438/619 |
| 6,221,562 B1 | 4/2001 | Boyd et al. | |
| 6,245,488 B1 | 6/2001 | Furukawa et al. | |
| 6,284,439 B1 | 9/2001 | Holmes et al. | |
| 6,313,492 B1 | 11/2001 | Hakey et al. | |
| 6,320,543 B1 | 11/2001 | Ohata et al. | |
| 6,338,934 B1 | 1/2002 | Chen et al. | |
| 6,440,635 B1 | 8/2002 | Holmes et al. | |
| 6,492,256 B2 | 12/2002 | Lee et al. | |
| 6,492,732 B2 | 12/2002 | Lee et al. | |
| 6,649,531 B2 | 11/2003 | Cote et al. | |
| 6,780,753 B2 | 8/2004 | Latchford et al. | |
| 6,805,109 B2 | 10/2004 | Cowan | |
| 7,030,031 B2 | 4/2006 | Wille et al. | |
| 7,041,748 B2 | 5/2006 | Lin et al. | |
| 7,056,840 B2 | 6/2006 | Miller et al. | |
| 7,071,532 B2 | 7/2006 | Geffken et al. | |
| 7,091,611 B2 | 8/2006 | Ahn et al. | |
| 7,138,329 B2 | 11/2006 | Lur et al. | |
| 7,253,095 B2 | 8/2007 | Lur et al. | |
| 7,265,013 B2 | 9/2007 | Furukawa et al. | |
| 7,306,853 B2 | 12/2007 | Lin et al. | |
| 7,338,896 B2 | 3/2008 | Vanhaelemeersch et al. | |
| 7,344,827 B2 | 3/2008 | Takemura et al. | |
| 7,361,454 B2 | 4/2008 | Kobayashi | |
| 7,361,991 B2 | 4/2008 | Saenger et al. | |
| 7,432,041 B2 | 10/2008 | Lin | |
| 7,585,614 B2 | 9/2009 | Furukawa et al. | |
| 7,709,370 B2 | 5/2010 | Allen et al. | |
| 7,790,576 B2 | 9/2010 | Bathan et al. | |
| 7,919,225 B2 | 4/2011 | Allen et al. | |
| 2001/0021577 A1 | 9/2001 | Brown et al. | |
| 2001/0054766 A1 | 12/2001 | Dirahoui et al. | |
| 2003/0127426 A1* | 7/2003 | Chang et al. | 216/41 |
| 2004/0094821 A1 | 5/2004 | Lur et al. | |
| 2004/0137241 A1* | 7/2004 | Lin et al. | 428/447 |
| 2004/0196688 A1 | 10/2004 | Yamamoto et al. | |
| 2004/0207001 A1 | 10/2004 | Kouznetsov et al. | |
| 2005/0009305 A1 | 1/2005 | Anderson et al. | |
| 2006/0038212 A1 | 2/2006 | Moore et al. | |
| 2007/0099416 A1 | 5/2007 | Furukawa et al. | |
| 2007/0166981 A1 | 7/2007 | Furukawa et al. | |
| 2008/0122106 A1 | 5/2008 | Nitta et al. | |
| 2008/0142995 A1 | 6/2008 | Furukawa et al. | |
| 2008/0187731 A1 | 8/2008 | Allen et al. | |
| 2008/0265377 A1 | 10/2008 | Clevenger et al. | |
| 2009/0079075 A1 | 3/2009 | Lin et al. | |
| 2009/0079076 A1 | 3/2009 | Lin et al. | |
| 2009/0081418 A1* | 3/2009 | Allen et al. | 428/195.1 |
| 2009/0149026 A1* | 6/2009 | Zhou et al. | 438/703 |
| 2009/0233226 A1 | 9/2009 | Allen et al. | |
| 2010/0009131 A1 | 1/2010 | Basker et al. | |
| 2010/0028801 A1 | 2/2010 | Holmes et al. | |
| 2010/0112463 A1 | 5/2010 | Yune | |
| 2010/0197096 A1* | 8/2010 | Johnson et al. | 438/268 |
| 2011/0130006 A1* | 6/2011 | Abatchev et al. | 438/703 |
| 2011/0193167 A1 | 8/2011 | Fung et al. | |
| 2013/0299883 A1 | 11/2013 | Lin et al. | |

OTHER PUBLICATIONS

Jung, W., et al. "Patterning With Amorphous Carbon Spacer for Expanding the Resolution Limit of Current Lithography Tool" Proc. of SPIE, vol. 6520, 65201C. Feb. 2007. pp. 1-9.

Jung, W., et al. "Patterning With Spacer for Expanding the Resolution Limit of Current Lithography Tool" Proc. of SPIE, vol. 6156, 61561J. Feb. 2006. pp. 1-9.

Final Office Action for U.S. Appl. No. 13/088,083 mailed on Mar. 19, 2014.

Final Office Action for U.S. Appl. No. 13/088,110 mailed on Mar. 20, 2014.

Office Action mailed on Oct. 28, 2014 for U.S. Appl. No. 13/228,023.

Final Office Action mailed on Jan. 14, 2015 for U.S. Appl. No. 13/228,023.

Non-Final Office Action for U.S. Appl. No. 13/970,124 mailed on Feb. 23, 2015.

U.S. Office Action mailed May 1, 2015 in U.S. Appl. No. 13/228,023.

* cited by examiner

SELF-ALIGNED FINE PITCH PERMANENT ON-CHIP INTERCONNECT STRUCTURES AND METHOD OF FABRICATION

RELATED APPLICATION INFORMATION

This application is a Continuation application of co-pending U.S. patent application Ser. No. 13/197,325 filed on Aug. 3, 2011, incorporated herein by reference in its entirety.

This application is related to commonly assigned application Ser. No. 13/088,054, entitled: INTERCONNECT STRUCTURE AND METHOD FOR FABRICATING ON-CHIP INTERCONNECT STRUCTURES BY IMAGE REVERSAL, commonly assigned application Ser. No. 13/088,083, entitled: SELF-ALIGNED AIRGAP INTERCONNECT STRUCTURES AND METHODS OF FABRICATION, and commonly assigned application Ser. No. 13/088,110, entitled: MIDDLE OF LINE STRUCTURES AND METHODS FOR FABRICATION, all filed concurrently on Apr. 15, 2011 and incorporated herein by reference.

BACKGROUND

1. Technical Field

The present invention relates to semiconductor interconnect structures and fabrication methods, and in particular to fine or multiple pitch interconnect structures made by a sidewall image transfer technique.

2. Description of the Related Art

The speed of propagation of interconnect signals is an important factor controlling overall circuit speed as feature sizes are reduced and the number of devices per unit area and number of interconnect levels are increased. Throughout the semiconductor industry, there has been a strong drive to reduce the dielectric constant, k, of the interlayer dielectric (ILD) materials used to electrically insulate metal lines. As a result, interconnect signals travel faster through conductors due to a reduction in resistance-capacitance (RC) delays.

Semiconductor chips may employ copper (Cu) as the electrical conductor, organosilicates as the low dielectric constant (low-k) dielectric, and multiple levels of Cu/low-k interconnect layers. These Cu/low-k interconnect layers are fabricated with an iterative additive process, called dual-damascene, which includes several processing steps including, for example, film deposition, patterning by lithography and reactive ion etching, liner (Cu barrier) deposition, Cu metal fill by electrochemical plating, and chemical-mechanical polishing of excessive Cu metal.

Traditional dual-damascene integration suffers from poor reliability, particularly in porous low-k dielectric material. While hardmask layers may serve to protect the low-k material, the presence of sacrificial hardmask layers adds enormous process complexity and manufacturing as additional film deposition, pattern transfer etch, and removal of the hardmask layers are needed. Even with a hardmask, the process induced dielectric damage on the top surface of the dielectric results in a dielectric breakdown in this region during electrical reliability tests. The processes that could induce dielectric damage include chemical mechanical polishing, cleaning, and reactive ion etching.

A back-end-of-the-line (BEOL) integration process, called a low temperature oxide (LTO) process, employs a plurality of layers (e.g., 8 or more) of sacrificial hardmask materials to fabricate a two-layer dual-damascene interconnect structure. Although immensely popular in semiconductor manufacturing, the dual-damascene integration scheme suffers from several drawbacks including the following. The dual-damascene integration scheme constitutes a significant portion of manufacturing cost of advanced semiconductor chips as many layers are needed to form connections. The dual-damascene integration scheme is a main yield detractor as the many layers of films needed to form interconnects generate opportunities for defect introduction and, thus, degrade manufacturing yields. The dual damascene integration is very inefficient and embodies enormous complexity. The current dual-damascene integration scheme requires many sacrificial films (e.g., 80% of the film stack) to pattern and protect the fragile interlayer dielectric films from damage during processing. These sacrificial patterning and protective films have to be removed after patterning and copper plating.

In addition, the performance gain by introduction of new lower-k materials is often offset by the need for higher-k non-sacrificial protective materials, such as a cap layer, a hardmask layer, or a thicker copper barrier layer. The complex dual-damascene process lengthens manufacturing turn-around time and development cycles. Plasma etching processes for the dual-damascene integration scheme are also expensive and require significant up-front capital investment. The process induced dielectric damage can cause degradation in performance and reliability of the resultant chips.

SUMMARY

An interconnect structure and methods for making the same include sidewall portions of an interlevel dielectric layer. The sidewall portions have a width less than a minimum feature size for a given lithographic technology and the width is formed by a thickness of the interlevel dielectric layer when conformally formed on vertical surfaces of a mandrel. The sidewall portions form spaced-apart openings. Conductive structures fill the spaced-apart openings and are separated by the sidewall portions to form single damascene structures.

A method for fabricating an interconnect structure includes forming a pattern of resist structures having at least one pitch; conformally depositing an interlevel dielectric composition over the resist structures; etching the interlevel dielectric composition to expose the resist structures and to form sidewall portions of the interlevel dielectric composition; removing the resist structures to leave the sidewall portions to provide openings therebetween; and filling the openings with an electrically conductive fill material.

Another method for fabricating an interconnect structure includes forming a pattern of first resist structures having at least one pitch on an underlying layer; conformally depositing a first interlevel dielectric composition over the first resist structures; etching the first interlevel dielectric composition to expose the first resist structures and to form sidewall portions of the first interlevel dielectric composition; removing the resist structures to leave the sidewall portions to provide openings therebetween; depositing a second resist in the openings and on a surface of the first interlevel dielectric composition; patterning second resist structures from the second resist on top of the first interlevel dielectric composition; depositing a second interlevel dielectric composition over the first interlevel dielectric composition; etching the second interlevel dielectric composition to expose the second resist structures; removing the second resist structures to form second openings for forming interconnect structures; and filling the second openings with an electrically conductive fill material to form interconnect structures.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
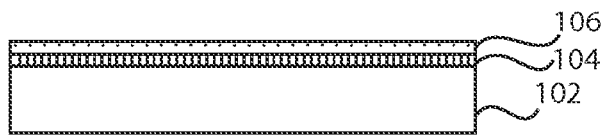
FIGS. 1A-1J show cross-sectional views of a device demonstrating a process flow for a single-damascene process according to an illustrative embodiment.

The present principles provide fine or multiple pitched interconnect structures and methods for fabrication. In particularly useful embodiments, single- and dual-damascene shaped interconnect structures are formed by a process similar to side wall image transfer. The present embodiments reduce fabrication steps and costs for back end of line (BEOL) interconnect structures and reduce plasma induced dielectric damage during, e.g., Cu/low-k dual damascene fabrication. The present principles provide self-aligned fine pitch interconnect structures for forming fine-pitch single-damascene BEOL structures and fine-pitch dual-damascene BEOL structures.

Advantages of the present invention include simplifying integration processes as reactive ion etching and related hardmasks are not needed, thus saving manufacturing costs. Reactive ion etching (RIE) is not needed to form openings for the interconnect structures, thus reducing dielectric damage by RIE and improving performance and reliability. Moreover, the methods disclosed herein also afford fine-pitched interconnect structures that are not possible to fabricate with traditional reactive ion etching techniques.

In some embodiments, an antireflective coating is formed on the semiconductor substrate prior to depositing the photoresist. In some embodiments, when an ARC is used, the ARC and patternable resist materials become part of a permanent dielectric material stack of the interconnect structure.

In accordance with the present principles, a number of photoresist steps and all other sacrificial materials and their related deposition, pattern transfer (etch) and removal processes used in prior art integration are reduced. In addition, the need for plasma etching, which is typically employed in patterning processes, is minimized. The reduced use of plasma etching reduces plasma-induced dielectric material damage, thus maintaining the performance gain for the introduction of lower dielectric constant on-chip insulators. Further, the methods as described herein reduce a number of layers needed to fabricate an interconnect structure and, as such, reduce the time and cost of fabricating interconnect structures as compared to prior art processes.

In the following description, numerous specific details are set forth, such as particular structures, components, materials, dimensions, processing steps and techniques, to provide a thorough understanding of the present principles. However, it will be appreciated by one of ordinary skill in the art that these specific details are illustrative and should not be construed as limiting. It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the interlayer dielectric materials employed herein may act as a low-k (low dielectric constant) dielectric insulator after a cure process (optional). The cured product of an interlayer dielectric material, therefore, can serve as an on-chip dielectric insulator. The terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of an interlayer dielectric material is the product of the interlayer dielectric material after it has undergone a cure process. The "cured" product of an interlayer dielectric material may be different from the original interlayer dielectric material in chemical nature and physical, mechanical and electrical properties.

It is to be understood that the present invention will be described in terms of a given illustrative architecture having a semiconductor wafer or substrate; however, other architectures, structures, substrate materials and process features and steps may be varied within the scope of the present invention.

Circuits or structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIGS. 1A-1J, a single-damascene method and structure 100 are shown in accordance with one illustrative embodiment. FIG. 1A shows a substrate 102 having an optional cap layer 104 and optional antireflection coating (ARC) 106 formed over the substrate 102. Although both layers 104 and 106 are shown, it should be understood that the cap layer 104 and ARC 106 may be employed without the other or may not be used at all.

The substrate 102 may include a semiconductor substrate, e.g., silicon, GaAs, silicon on insulator or may include lower level metal layers in interlevel dielectric materials. The substrate 102 may include an electrically semiconducting material, an insulating material, a conductive material, devices or structures made of these materials or any combination thereof (e.g., a lower level of an interconnect structure). When the substrate 102 is comprised of a semiconducting material, any semiconductor such as Si, SiGe, SiGeC, SiC, Ge alloys, GaAs, InAs, InP and other III/V or II/VI compound semiconductors, or organic semiconductors may be employed. The substrate 102 may also be a flexible substrate including devices that are suitable for high-speed roll-to-roll processing. In addition to these listed types of semiconducting materials, substrate 102 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices.

When the substrate 102 is an electrical insulating material, the insulating material can be an organic insulator, an inorganic insulator or a combination thereof including multilayers. The substrate 102 may also include a patternable low-k dielectric material as well. These electrical insulating materials may be part of a device or devices or structures, which may be discrete or interconnected. These devices and structures may be for logic applications, memory applications, etc. When the substrate 102 is an electrically conducting material, the substrate may include, for example, polysilicon, an elemental metal, an alloy including at least one elemental metal, a metal silicide, a metal nitride, etc. or combinations thereof including multilayers. When the substrate 100 includes a semiconducting material, one or more semiconductor devices such as, for example, complementary metal oxide semiconductor (CMOS) devices, strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

The optional cap 104 may be formed on the surface of substrate 102 utilizing a conventional deposition process such as, for example, chemical vapor deposition (CVD), plasma enhanced chemical vapor deposition (PECVD), atomic layer deposition (ALD), chemical solution deposition (such as spin coating), or evaporation. The dielectric cap 104 may include any suitable dielectric capping material such as, for example, SiC, SiN, $SiO_2$, a carbon doped oxide, a nitrogen and hydrogen doped silicon carbide SiC(N,H) or multilayers thereof. Dielectric cap 104 may be a continuous layer or a discontinuous layer. Dielectric cap 104 may also be a layer with graded composition in the vertical direction.

After the deposition of the dielectric cap 104, a post deposition treatment may be applied to modify the properties of either the entire layer or the surface of the dielectric cap 104. This post deposition treatment can be selected from heat treatment, irradiation of electromagnetic wave (such of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the dielectric cap 104, such as adhesion strength. The chemical properties include nature and/or location of surface functional groups and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate 102 can withstand, usually about 500° C. This heat treatment can be conducted in an inert environment or within a chemical environment in a gas phase or a liquid phase. This treatment step may or may not be performed in the same tool as that used in forming the dielectric cap 104.

The post deposition treatment by irradiation of electromagnetic waves can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions may be employed in some embodiments: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the dielectric cap 104.

The post deposition treatment by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the dielectric cap 104.

The post deposition chemical treatment may also be conducted in a gas phase or a liquid phase. In one embodiment, the following conditions may be employed: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire layer of dielectric cap 104 or may be limited only to the surface of the dielectric cap 104. Example chemicals include adhesion promoters such as silanes, siloxanes and silylation agents. This treatment step may or may not be performed in the same tool as that used in forming the dielectric cap 104.

The thickness of the dielectric cap 104 may vary depending on the technique used to form the same as well as the material make-up of the layer. The dielectric cap 104 may have a thickness from 2 nm to 55 nm, and more preferably a thickness from 10 nm to 45 nm.

Next, the optional ARC 106 is formed on a surface of the optional dielectric cap 104, if present, or directly on a surface of the substrate 102 when the dielectric cap 104 is not present. The ARC 106 may be a single layer, multilayer or a graded layer with a composition that varies along the vertical direction. The ARC 106: (i) acts as an antireflective coating (ARC) during a lithographic patterning process; (ii) withstands high-temperature back-end-of line (BEOL) integration processing (e.g., up to about 500° C.); (iii) prevents resist poisoning by the substrate 102; (iv) provides a vertical wall profile and sufficient etch selectivity between layers; (v) serves as a permanent dielectric layer in a chip (low dielectric constant, e.g., k<5, more commonly k<3.6); and (vi) is compatible with conventional BEOL integration and produces reliable hardware.

Antireflective coatings are known to those skilled in the art and include, for example, organic homopolymers or copolymers of polyesters, polyimides, polyacrylates, polymethacrylates, polysulfones, and amorphous carbon that satisfy all of the characteristics of ARC 106 mentioned above. The ARC 106 may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. The ARC 106 may include atoms of M, carbon (C) and hydrogen (H), wherein M is at least one of Si, Ge, B, Sn, Fe, Ta, Ti, Ni, Hf and La.

When ARC 106 is a multilayer ARC, the deposition of each layer may be the same or a combination of deposition methods can be used. After applying ARC 106, particularly those from a liquid phase, a post deposition baking step is usually needed to remove unwanted components, such as solvent, and to effect crosslinking. The post deposition baking step of ARC 106 is typically, but not necessarily always, performed at a temperature from 80° C. to 300° C., with a baking temperature from 120° C. to 200° C. being even more typical. Other post-deposition treatments (e.g., similar to cap layer 104) may be performed.

Figure 1B:
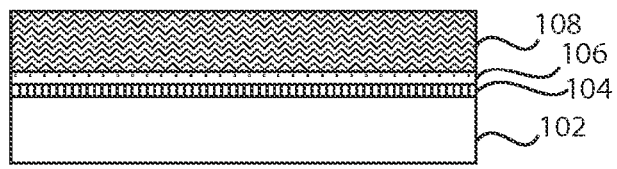

In FIG. 1B, a resist material 108 is deposited. The material 108 may include chemically amplified photoresists, non-chemically amplified photoresists, positive-tone or negative tone. Processing of material 108 may include a deposition process including, for example, spin-on-coating, dip coating, brush coating, and ink-jet dispensing. After applying the material 108, a post deposition baking step may be performed to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical.

The thickness of the material 108 may vary depending on the requirements of a chip being fabricated, the method being employed to form the same, and the make-up of the material 108. The photoresist material 108 may have a thickness from 1 nm to 50,000 nm, with a thickness from 20 nm to 5000 nm being preferred. The pattern-wise exposing process can be accomplished in a variety of ways, including, for example, exposure through a mask with a lithography stepper or a scanner with an exposure light source of G-line, I-line (365 nm), DUV (248 nm, 193 nm, 157 nm, 126 nm), Extreme UV (EUV) (13.4 nm, 6.5 nm), an electron beam, an ion beam, etc. The exposing process may be performed in a dry mode or an immersion mode. The exposing process may be performed with a single exposure or multiple exposures. The pattern-wise exposing process may include direct writing without the use of a mask with, for example, light, electron beam, ion beam, and scanning probe lithography. Other patterning techniques that can be used include contact printing techniques such as nano-imprint lithography, embossing, micro contact printing, replica molding, micro-transfer molding, micro-molding in capillaries and solvent-assisted micromolding, thermal assisted embossing, inject printing, and the like.

An optional post-exposure baking may be employed to affect the photochemical reactions. When performed, the baking step is conducted at a temperature from 60° to 200° C., with a baking temperature from 80° to 140° C. being even more typical. The duration of the baking step varies and is not critical to the practice of the present invention.

Figure 1C:
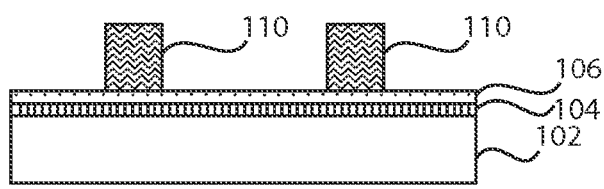

Referring to FIG. 1C, a reversed-tone mask and a positive- or negative-tone photoresist 108 are employed to form features 110 with vias or trenches therebetween. The features 110 provide a patterned image for the later formed interconnect vias and trenches, after exposure and post-exposure baking. Latent images or patterns 110 are developed with an appropriate developer, usually an aqueous based solution, such as, e.g., 0.26N tetramethylammoniahydroxide (TMAH) solution.

Figure 1D:
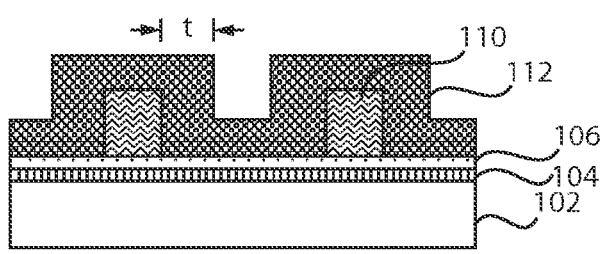

Referring to FIG. 1D, an interlevel dielectric (ILD) 112 is deposited. The deposition process may include, for example, spin-on-coating, dip coating, brush coating, doctor blade coating, and ink-jet dispensing. However, in preferred embodiments, the ILD 112 is formulated such that it is compatible with the underlying photoresist pattern 110, i.e., the application of the ILD 112 does not substantially alter the dimension and profile of the resist patterns 110. In one preferred embodiment, the resist/ILD layer 112 is preferably conformally formed with a low-temperature ILD deposition (e.g., less than 400 degrees C., and more preferably between room temperature and 200 degrees C.).

The ILD 112 includes a predetermined thickness selected to provide shapes (116) that will be employed to space apart back end of line (BEOL) conductors. The selected thickness of the ILD 112 will preferably be comparable to the height of the resist pattern 110. The resist pattern structures 110 are spaced apart enough to enable two ILD layer thicknesses and a comparably sized gap between them. In other words, the ILD 112 having a thickness t should have resist structure 110 gapped by a distance of about 3t. Other embodiments may have a larger or smaller relationship as needed. It should be understood that the thickness t may include subminimum feature size dimensions (e.g., about 10 nm or greater) where a minimum feature size is the smallest dimensions obtainable by lithographic processing (e.g., about 80 nm). In this regard, the nanoscale dimensions may be obtained for t, enabling nanoscale dimensions for single damascene conductors and dielectric materials between the conductors. The thickness of ILD layer 112 may be from about 10 nm to about one micron.

To provide conformal deposition, in one particularly useful embodiment, an atomic layer deposition (ALD) process may be employed. The ALD process involves sequential/cyclic flow of precursor and reactant species separated by a purge step (e.g., a chamber purge). This process is self-limited when all the dangling bonds on the surface of the substrate 102 or underlying layer (104, 106) are saturated with precursor ligands, i.e., the flow of reactant results in the conversion of the precursor ligands into a compound. The ALD process is a monolayer by monolayer deposition, and offers excellent conformal deposition. While thermal a plasma assisted ALD process enables an ALD process that may be performed at lower temperatures (e.g., room temperature to 200 degrees C.), other embodiments may employ a chemical vapor deposition process for depositing ILD 112 (preferably a remote plasma instead of a direct plasma to reduce surface damage).

The ILD 112 may include $SiO_2$, SiC, SiN, SiCN or other conformally formed dielectrics. For an illustrative conformal $SiO_2$ process, a first precursor is often organic or inorganic amine based chemistry. The organic ($-C_xH_y$) aminosilane precursors are often used due to their high reactivity to allow the lower temperature deposition. Some examples include mono-, di-, tri-Isoalkyl (or alkoxy) aminosilane, Trisilyl amine, etc. These precursors provide a source of silicon. A second reactant includes an oxidizer such as $O_2$ or $N_2O$, which is converted into active oxygen radicals through a remote plasma process. These reactive oxygen radicals then react with the surface molecules, breaking up/oxidizing $-NH$ bonds and $-C_xH_y$ bonds to form $NH_3$, $CO_2$, and converting the surface to $SiO_2$. The plasma process allows the reaction to take place at as low as room temperature (e.g., about 20 degrees C.). For the resist compatibility (e.g., maintaining integrity of the resist during the deposition of Oxide around it), very low RF power is used during the initial few cycles. Since reaction is self-limited (stops when the reactants are exhausted), fairly accurate thicknesses can be deposited by controlling the number of cycles. The conformity of the ILD 112 is above 95%, and the ILD 112 provides for the sidewall image transfer application in accordance with the present principles.

The ILD 112 is preferably formed at low temperatures to permit the use of resist structures 110 without significant degradation of the resist 110. Further, the low temperature process is beneficial for the device and process as a whole.

After applying the ILD material, a post deposition baking/curing step may be employed to remove unwanted components and to improve the quality of the ILD 112. When performed, the baking step is conducted at a temperature from 40° C. to 200° C., with a baking temperature from 60° C. to 140° C. being even more preferred. The duration of the baking step may vary from 10 seconds to 600 seconds and is not critical.

The ILD 112 may include any dielectric material compositions that are conformally formed and compatible with the pattern photoresist structures. In one embodiment, the ILD 112 may be used as deposited as a permanent ILD. In another embodiment, the ILD 112 may be cured to form a patterned permanent dielectric. The cured product of the ILD 112, therefore, can serve as a permanent on-chip dielectric insulator (ILD 116). In the present disclosure, the terms "cure" or "curing" are used interchangeable to refer one of the processes selected from a thermal cure, an electron beam cure, an ultra-violet (UV) cure, an ion beam cure, a plasma cure, a microwave cure or a combination thereof. A thermal cure may include temperatures of between about 40 degrees C. and 550 degrees C., and preferably between about 40 degrees C. and 160 degrees C.

Figure 1E:
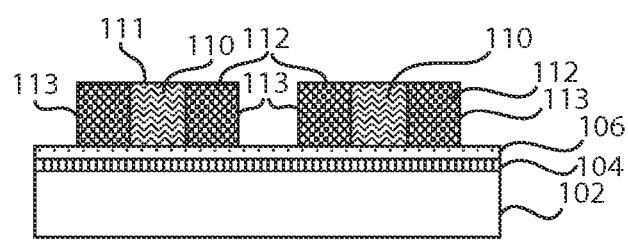

Referring to FIG. 1E, the ILD 112 is etched down to the pattern 110 and to remove ILD 112 from the underlying layer by dry etching, wet etching, polishing or other methods to expose a resist top surface 111. This polishing or etching provides access to the resist pattern structure 110 to enable removal. In one embodiment, a reactive ion etch (RIE) is performed to remove the ILD 112 over the resist structure 110.

The etching should preserve the thickness t on sidewalls 113 of ILD 112. In one illustrative example, t is 40 nm or less. The ILD structure 112 is preferably evenly spaced (e.g., equal pitch, which may be for example 120 nm), but may be formed with different spacings (e.g., multiple pitches) depending of the chip design/layout.

Figure 1F:
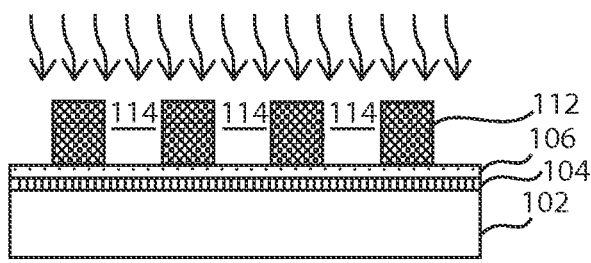

Referring to FIG. 1F, the resist pattern 110 may be removed by a wet method, a dry method, heat, UV light or a combination thereof. In one embodiment, a wet method is employed with an appropriate developer. The wet method may also include an irradiation step to render the resist soluble in the developer or the wet etch can simply decompose and wash away the resist pattern 110. In another embodiment, a dry method is employed with an appropriate selective reactive ion etching that removes only the exposed resist. In yet another embodiment, a dry method is employed by using heat or UV irradiation to remove exposed resist. These selective removal methods leave openings 114 within the dielectric layer 112.

Figure 1G:
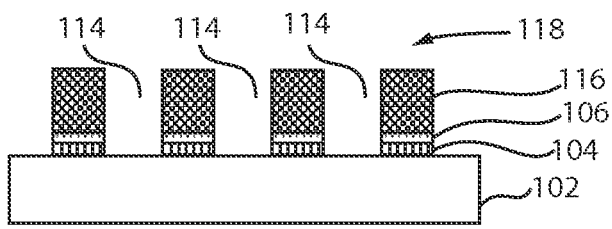

The absence of resist pattern 110 leaves openings 114 that form an interconnect pattern of openings 118 (see FIG. 1G). The patterned dielectric structure is formed by removing the resist 110 and curing the ILD 112 composite structures (if not done earlier). The curing is optional depending on material selection and desired quality for ILD 112 and may be performed with heat, UV, or E-beam (tone inversion in ILD) to form a permanent (cured) interconnect dielectric layer 116. After forming the interconnect pattern of openings 118 (and curing to form the ILD 116, if needed), a patterned (and cured) dielectric material 116, as shown in FIG. 1G, provides a permanent dielectric material which is employed to insulate conductive structures. Depending on the material selection ILD 112 may not need to be processed to become the permanent ILD 116 and may instead become the permanent ILD 116 upon its formation (as layer ILD 112).

Curing, if needed, may be performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it converts the interlevel dielectric composition into a low k (e.g., less than about 4.3) film and maintains pattern fidelity.

In one embodiment, an optional irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof. The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He and Ar. The UV/thermal cure temperature may be from 100° C. to 500° C., with a cure temperature from 300° C. to 450° C. being more common. The duration of the UV/thermal cure is from 0.5 min to 30 min with duration from 1 min to 10 min being more common. The UV cure module is designed to have a very low oxygen content to avoid degradation of the resultant dielectric materials. This post-patterning cure, if performed, may be in different or the same tool cluster as that of the patterning step.

The thickness of the patterned and cured interlevel dielectric (ILD) 116 may vary depending on the requirements of the chip and the technique used to form the same as well as the material make-up of the layer. The patterned and cured ILD 116 may have a thickness, e.g., from 1 nm to 50000 nm, with a thickness from 10 nm to 5000 nm being preferable.

Referring again to FIG. 1G, if ARC 106 or cap layers 104 are employed, a cap open process is employed to expose the underlying substrate 102 (or metal lines). The cap open process preferably includes an etching process that selectively etches one or both of the ARC 106 and/or cap layer 104 relative to the layer 116.

Figure 1H:
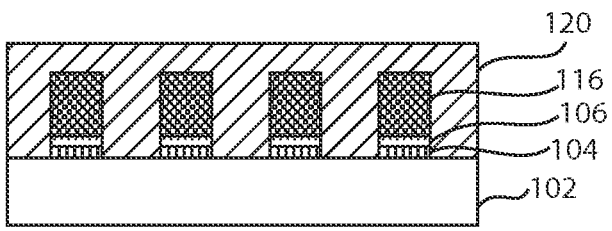

Referring to FIG. 1H, a metallization process includes depositing a conductor 120 into openings 118 (FIG. 1G) in layer 116 and over a top surface of dielectric layer 116. The conductor 120 may include copper, aluminum, tungsten, titanium, doped polysilicon or any other useful conductive material or alloys/combinations thereof. The conductor 120 may be deposited using chemical vapor deposition (CVD) or other deposition techniques. The openings 118 are filled with conductive material 120.

Figure 1I:
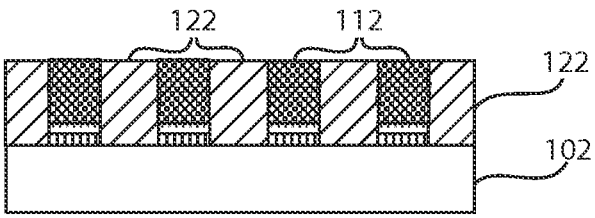

Referring to FIG. 1I, a chemical-mechanical polish (CMP) is performed to remove excess conductor 120 from the surface of dielectric layer 116 to form a conductive structures (e.g., metal lines or vias) 122 in a single damascene process. Other planarization processes may also be employed.

Figure 1J:
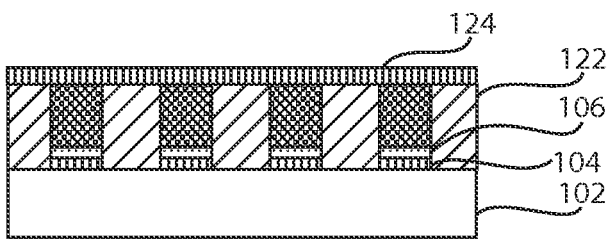

Referring to FIG. 1J, a cap deposition may be employed to form a cap layer 124 prior to beginning a next metallization layer for connecting the substrate 102 (or lower metallization) to a higher conductor (not shown) using a single damascene integration.

The present process enables a wider choice of patterning materials, e.g., any spin-on resist 108 may be employed. Well-developed resists and lithography techniques may be employed including both positive-tone, negative-tone resists. The present methods are compatible with immersion lithography and multi-exposure patterning. The present methods generate fine pitch or multi-pitched spacings using ILD 112. The present methods offer ways to reduce Line Edge Roughness (LER) through post resist patterning cure processes.

In accordance with the present embodiments, pitch changes may be made to conductors using lithographic patterning of positions of resist structures 110. Sizes of the dielectric gaps between the conductors using the deposition of the ILD 112 and its thickness to form sub lithographic sized features (e.g., dielectric between openings 114) all contribute to the flexibility of the present principles. The present principles are also applicable to large dimensions (e.g., lithographic sized or larger features). Since the patterns are defined lithographically, multiple different pitches and different wire routing configurations may be concurrently fabricated. The ILD 112 is self-aligned to the resist structures 110 increasing accuracy and reliability over large areas of the chip.

The present embodiments provide a simple and low-cost BEOL process that dramatically reduces film stacks and process steps and uses well-developed resists and lithography techniques. Sidewall image transfer methods are capable of mass production in memory products. The present principles are compatible with immersion lithography and multi-exposure patterning. In addition, etching to form trenches for conductor filing is avoided along with their associated drawbacks. For example, low ILD damage is achieved due to minimal etching. Since the openings 114 rely on resist development and processing, different profiles may be formed that are not possible with etching methods.

Referring to FIGS. 2A-2H, an illustrative process shows the concurrent formation of multiple pitched conductors in a single damascene process.

Figure 2A:
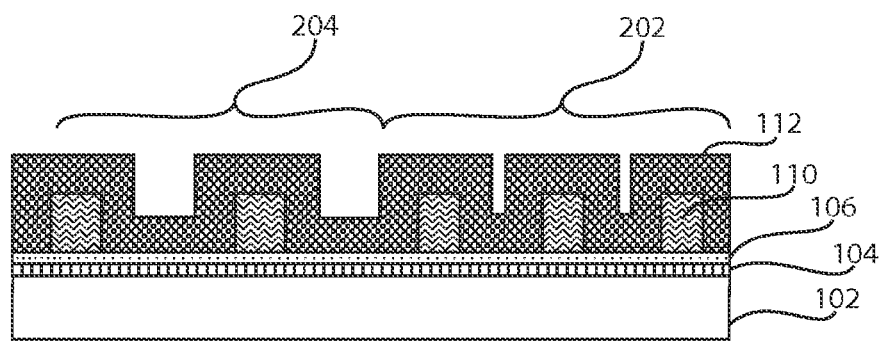
FIGS. 2A-2H show cross-sectional views of a device demonstrating another process flow for a single-damascene process for processing multiple pitches on a same device chip according to another illustrative embodiment.

Referring to FIG. 2A, a resist or ILD 112 is formed over a lithographically fabricated resist pattern 110. In this example, the ILD 112 is formed using an atomic layer deposition (ALD) process and may include an oxide. The structures depicted include two or more different pitches, e.g., a first pitch region 202 and a second pitch region 204.

Figure 2B:
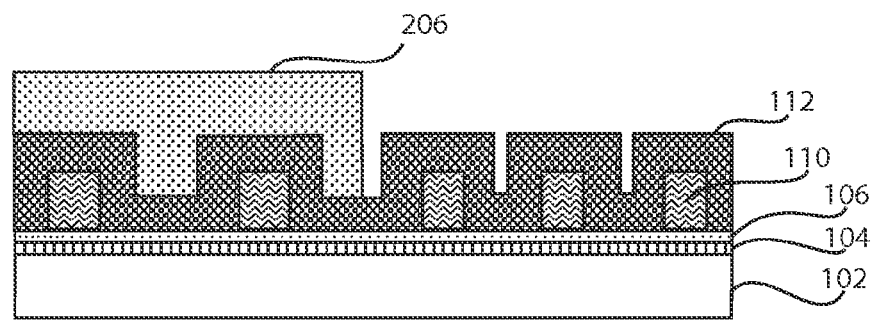
Figure 2C:
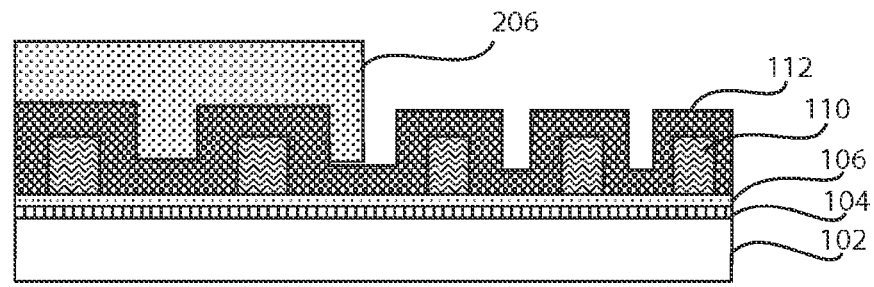
Figure 2D:
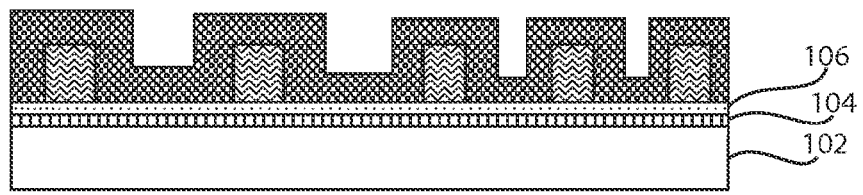

In FIG. 2B, one of the pitch regions is covered by a mask 206 with a different selectivity relative to the ILD 112. The mask 206 may include a SiN or the like. In FIG. 2C, an optional etch process may be performed to adjust the thickness of the ILD 112 in the second pitch area 204. The mask 206 is then stripped off in FIG. 2D.

Figure 2E:
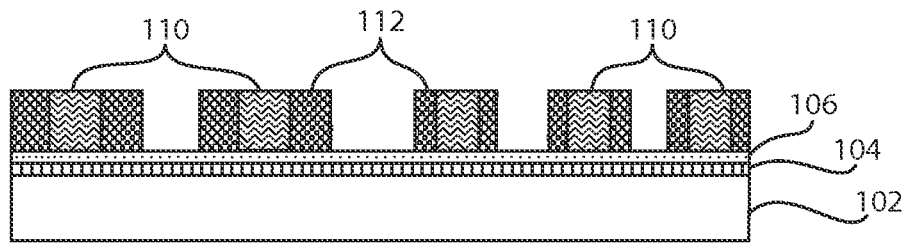
Figure 2F:
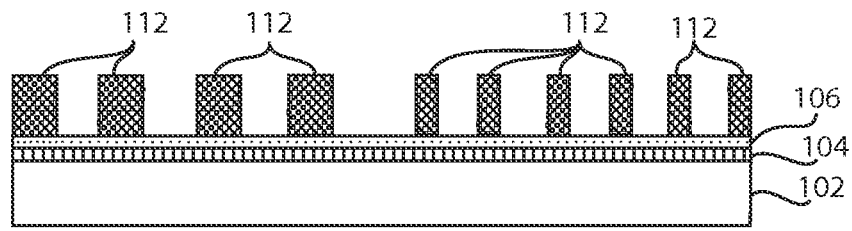
Figure 2G:
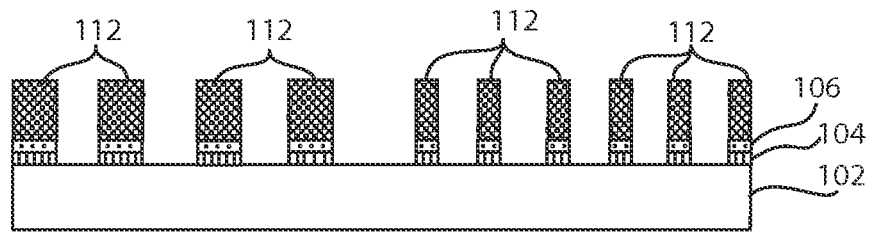
Figure 2H:
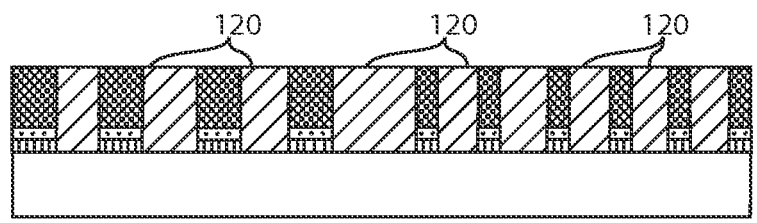

In FIG. 2E, a selective etch is performed to expose the resist pattern 110. In FIG. 2F, the resist pattern 110 (mandrels) are removed by etching, irradiation and etching, etc. ILD 112 may be cured to form ILD 116. In FIG. 2G, an ARC/cap open process may be performed if these layers are present. In FIG. 2H, a conductive material 120 is deposited and planarized to form single damascene conductors having multiple pitches. Although two different pitches are shown, additional numbers of pitched and patterns may also be provided as well.

Figure 3C:
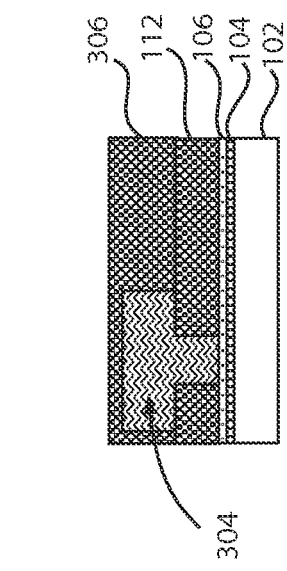
FIGS. 3A-3F show cross-sectional views of a device demonstrating a process flow for a dual-damascene process according to an illustrative embodiment.
Figure 3F:
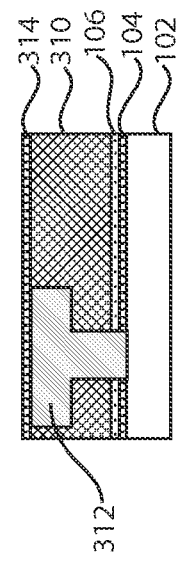
Figure 3B:
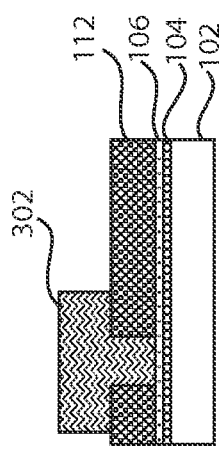
Figure 3E:
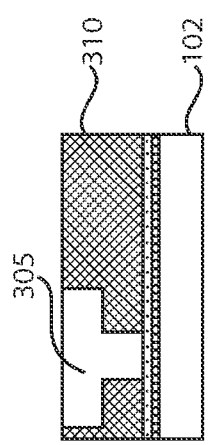
Figure 3A:
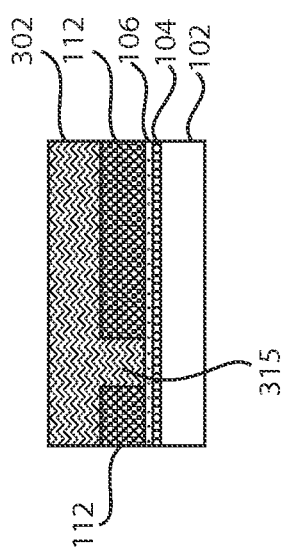

Referring to FIG. 3A, another illustrative embodiment may be employed for dual-damascene structure integration. The process steps for this embodiment follow those of FIGS. 1A-1F. In one embodiment, after curing the ILD 112 (if needed), in FIG. 3A, a second photoresist 302 is formed on the ILD 112 and fills an opening 315 formed by removing the photoresist features 110. The second resist 302 may include a positive- or negative-tone photoresist (e.g., similar to resist 110).

Referring to FIG. 3B, second resist 302 is patterned using a pattern-wise exposure to irradiation, e.g., UV light, EUV, E-beam, etc. Dual damascene patterns 304 are formed by selective removal of the exposed (or unexposed) areas by a liquid (development).

Figure 3D:
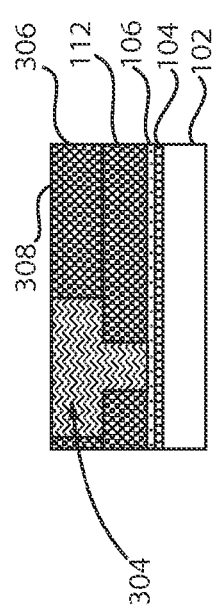

Referring to FIG. 3C, an ILD layer 306 (equivalent to layer 112) is deposited to fill between resist structures 304 (only one resist structure is depicted for simplicity). ILD 306 can be the same or different from ILD composition 112. In FIG. 3D, a surface 308 of layer 306 is planarized to expose the second resist pattern 304 using the same or similar method described in the single damascene case. In FIG. 3E, the second resist 302 is developed or otherwise removed using the same method(s) described in the single damascene case. This leaves an open dual damascene structure. The ILD 306 is then cured, if needed, by heat, irradiation energy (heat, UV, electron beam), etc. to form a patterned and cured dielectric layer 310. In FIG. 3F, if present, an ARC layer 106 and/or a cap layer 104 are opened up and a metallization process is performed. The metallization process includes depositing a conductive material in open structure 305 (and opened ARC 106 and cap layer 104) and planarizing the conductive material to form a dual damascene interconnect 312. A cap layer 314 may be formed over the dual damascene interconnect structure 312. The process may be continued with other layers and back end or the line (BEOL) processing.

In one embodiment, the further processing may include the formation of air gaps between dual damascene structures. Beginning with the structure of FIG. 3F, additional processing steps may take advantage of the cured second interlevel dielectric layer 310.

Figure 4A:
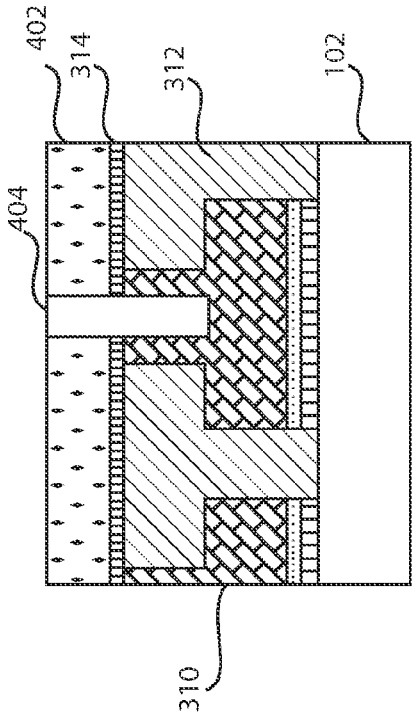
FIG. 4A-4D show cross-sectional views of the device of FIG. 3F demonstrating a process flow for forming air gaps between conductive dual-damascene structures according to an illustrative embodiment.

Referring to FIG. 4A, a mask layer 402 is formed over the cap layer 314. The layer 402 may include a resist material or other compatible mask material.

Figure 4B:
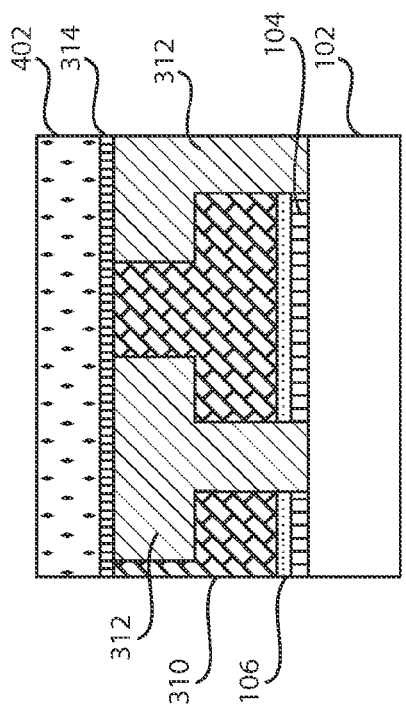
Figure 4C:
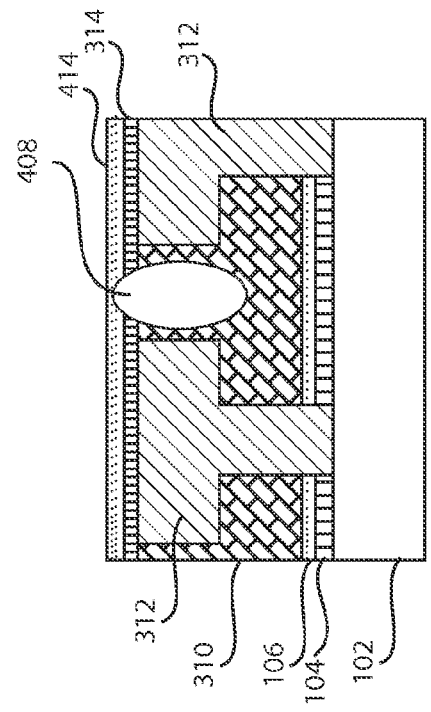

In FIG. 4B, the mask layer 402 is patterned and holes 404 are opened up between dual damascene structures 312 through the cap layer 314 and into the second dielectric layer 310. The mask layer 402 is removed as shown in FIG. 4C.

Figure 4D:
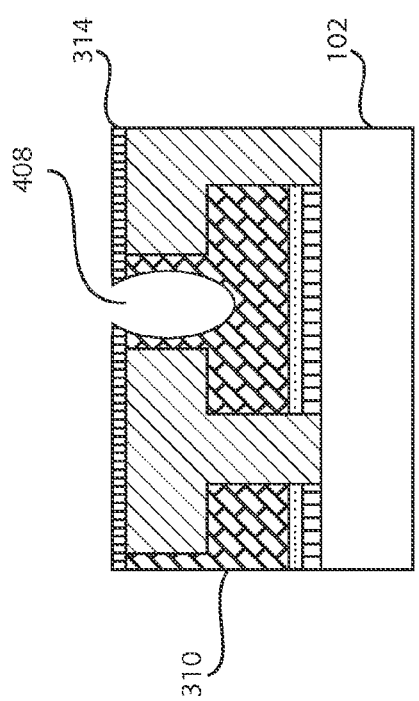

Referring to FIG. 4D, an etch process is performed to open up the second dielectric layer 310 to form a larger air gap 408 between structures 312. The etch process may include a reactive ion etch, or other suitable etching process. An ARC layer or other layer 414 may be formed by a deposition process to cap the air gap 408, and processing may continue. The air gaps 408 preferably provide additional electrical isolation between conductive structures 312.

Figure 5:
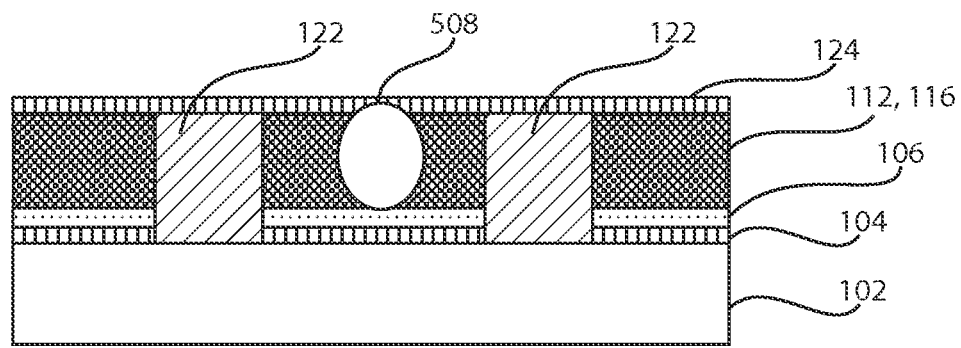
FIG. 5 shows a cross-sectional view of a device having single damascene conductive structures with air gaps formed in accordance with one illustrative embodiment.

A single damascene structure may include air gaps as well. FIG. 5 shows single damascene conductors 122 with an air gap 508 formed therebetween. A cap layer 124 (or ARC) may be formed over the air gap 508. Note that the structures 122 may form lines or may form contacts.

Figure 6:
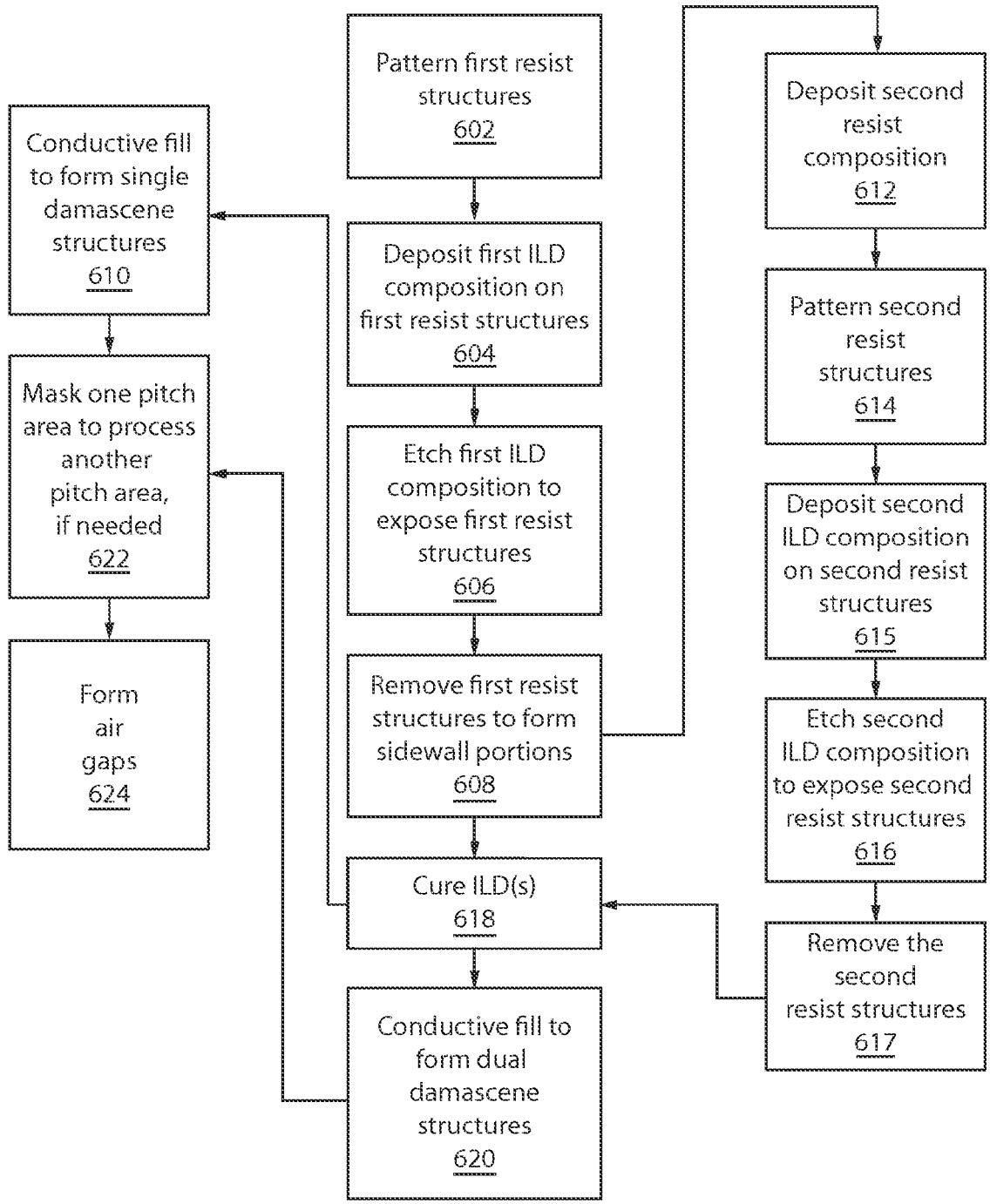
FIG. 6 is a block/flow diagram describing single and dual damascene process flow in accordance with illustrative embodiments.

Referring to FIG. 6, in a block/flow diagram showing single and dual damascene process flows in accordance with illustrative embodiments. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

In block 602, a pattern of first resist structures having at least one pitch on an underlying layer is formed. The first resist structures may be formed on one or more of a cap layer and an anti-reflection layer wherein the one or more of the cap layer and the anti-reflection layer are opened prior to filling with conductive material. The first resist structures are preferably formed with a width of a minimum feature size and the sidewall portions are formed with a dimension less than the minimum feature size.

In block 604, a first interlevel dielectric (ILD) composition is conformally deposited over the first resist structures. In block 606, the first interlevel dielectric composition is etched to expose the first resist structures and to form sidewall portions of the first interlevel dielectric composition. The etching may include removing excess interlevel dielectric composition to expose a top surface of the first resist structures by one of a wet removal, a reactive ion etch or a combination of both.

In block 608, the resist structures are removed to leave the sidewall portions to provide openings therebetween. The first ILD may be cured (block 618) to convert the interlevel dielectric composition into a permanent interlevel dielectric layer. In block 610, a conductive fill is performed to provide single damascene structures.

For dual damascene structures, in block 612, a second resist is deposited in the openings and on a surface of the first interlevel dielectric composition (from block 608). In block 614, second resist structures are patterned on top of the first interlevel dielectric composition. In block 615, a second interlevel dielectric composition is deposited over the second resist structures. In block 616, the second interlevel dielectric composition is etched to expose the second resist structures. In block 617, the second photoresist structures are removed to form second openings for forming interconnect structures. In block 618, one, none or both of the first interlevel dielectric composition and the second interlevel dielectric composition may be cured to convert the interlevel dielectric composition into a permanent interlevel dielectric layer. In block 620, the second openings are filled with an electrically conductive fill material to form interconnect structures.

In block 622, the resist structures may have a plurality of pitches and a method for processing these structures includes masking an area with a first pitch to process an area with a second pitch. In block 624, at least one air gap may be formed between interconnect structures. The air gaps may be formed in at least one of the first interlevel dielectric composition and the second interlevel dielectric composition between the interconnect structures.

Having described preferred embodiments for self-aligned fine pitch permanent on-chip interconnect structures and methods of fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An interconnect structure for an integrated circuit device, comprising:
   a plurality of sidewall portions of an interlevel dielectric layer, the sidewall portions having a width less than a minimum feature size for a given lithographic technology and the width being formed by a thickness of the interlevel dielectric layer when conformally formed on vertical surfaces of a mandrel, the sidewall portions forming spaced-apart openings; and
   conductive structures filling the spaced-apart openings and separated by the sidewall portions to form single damascene structures, wherein the conductive structures are the interconnects to semiconductor devices in a substrate that the interlevel dielectric layer is present on, wherein each interface between the interconnects and the plurality of sidewall portions is planar.

2. The interconnect structure as recited in claim 1, wherein the interlevel dielectric layer includes a patterned and cured resist which forms a permanent dielectric material.

3. The interconnect structure as recited in claim 1, wherein the thickness of the interlevel dielectric layer includes about 10 nm to about 80 nm.

4. The interconnect structure as recited in claim 1, wherein the interlevel dielectric layer is formed on a permanent anti-reflective coating.

5. The interconnect structure as recited in claim 1, wherein the conductive structures include air gaps formed between the conductive structures.

6. The interconnect structure as recited in claim 1, wherein the conductive structures include dual damascene structures.

7. The interconnect structure as recited in claim 1, wherein the sidewall portions include a plurality of different pitches.

8. The interconnect structure as recited in claim 1, wherein the sidewall portions include a plurality of different thicknesses.

9. The interconnect structure as recited in claim 1, wherein the width that is said minimum feature size ranges from 10 nm to 80 nm.

* * * * *